United States Patent
Matsumoto

(10) Patent No.: US 9,881,770 B2
(45) Date of Patent: Jan. 30, 2018

(54) MULTI CHARGED PARTICLE BEAM EXPOSING METHOD, AND MULTI CHARGED PARTICLE BEAM EXPOSING APPARATUS

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/405,443

(22) Filed: Jan. 13, 2017

(65) Prior Publication Data

US 2017/0207064 A1   Jul. 20, 2017

(30) Foreign Application Priority Data

Jan. 19, 2016   (JP) ................. 2016-008017

(51) Int. Cl.
  *H01J 37/04* (2006.01)
  *H01J 37/30* (2006.01)
  (Continued)

(52) U.S. Cl.
  CPC .......... *H01J 37/3023* (2013.01); *H01J 37/20* (2013.01); *H01J 37/3177* (2013.01); *H01J 2237/30472* (2013.01)

(58) Field of Classification Search
  USPC .... 250/396 R, 453.11, 492.1, 492.2, 492.21, 250/492.3, 526
  See application file for complete search history.

(56) References Cited

U.S. PATENT DOCUMENTS

| | | | | |
|---|---|---|---|---|
| 4,553,029 A | * | 11/1985 | Matsuda | ............... H01J 49/06 250/296 |
| 9,202,673 B2 | * | 12/2015 | Matsumoto | ......... H01J 37/3174 |
| 2014/0124684 A1 | * | 5/2014 | Matsumoto | ......... H01J 37/3174 250/492.3 |

FOREIGN PATENT DOCUMENTS

| JP | 2014-112639 | 6/2014 |
|---|---|---|
| JP | 2015-2189 | 1/2015 |
| TW | 201535462 A | 9/2015 |

OTHER PUBLICATIONS

Taiwanese Office Action dated Nov. 3, 2017 in Taiwanese Application No. 10621123670 (with English translation), 10 pages.

* cited by examiner

Primary Examiner — Bernard Souw
(74) Attorney, Agent, or Firm — Oblon, McClelland, Maier & Neustadt, L.L.P.

(57) ABSTRACT

A multi charged particle beam exposing method includes setting, in multiple exposures by a plurality of shots of each beam of multi-beams where the plurality of shots continuously irradiate a same irradiation position, a plurality of clock periods including at least one different clock period where the plurality of clock periods individually control an irradiation time of each beam of the multi-beams such that a clock period of at least one exposure processing differs from clock periods of other exposure processing, and exposing respective corresponding irradiation positions on a target object with the multi-beams by controlling, in each exposure processing of the multiple exposures, the irradiation time in exposure processing concerned using a clock period which has been set in the plurality of clock periods including the at least one different clock period.

10 Claims, 11 Drawing Sheets

(51) Int. Cl.
*H01J 49/06* (2006.01)
*H01J 37/302* (2006.01)
*H01J 37/20* (2006.01)
*H01J 37/317* (2006.01)

| Irradiation Step | The Number of Bits That Can Control Time | Time Control Unit (1/CLK2) | Time Control Range | Data Transmission Amount (bit) |
|---|---|---|---|---|
| 1 | 5 | Δ | 0, Δ, .., 31Δ | 5 |
| 2 | 5 | 32Δ | 0, 32Δ, ,992Δ | 5 |

FIG.9

| Irradiation Step | The Number of Bits That can Control Time | Time Control Unit (1/CLK2) | Time Control Range | Data Transmission Amount (bit) |
|---|---|---|---|---|
| 1 | 4 | Δ | 0, Δ, .., 15Δ | 4 |
| 2 | 3 | 16Δ (=$2^4$Δ) | 0, 16Δ,.. ,112Δ | 3 |
| 3 | 3 | 128Δ(=$2^{4+3}$Δ) | 0, 128Δ ,..., 896Δ | 3 |

FIG.10

| Control Method | The Number of Control Bits for One Exposure Time | Gray Level of One Exposure | Multiplicity | Total Exposure Gray Levels | Data Transmission Amount (bit) |
|---|---|---|---|---|---|
| Comparative Example 1 | N <10> | $2^N-1$ <1023> | 1 | $2^N-1$ <1023> | N <10> |
| Comparative Example 2 | n <5> | $2^n-1$ <31> | m <32> | $(2^n-1)$ m - m <960> | nm <160> |

FIG.12

MULTI CHARGED PARTICLE BEAM EXPOSING METHOD, AND MULTI CHARGED PARTICLE BEAM EXPOSING APPARATUS

CROSS-REFERENCE TO RELATED APPLICATION

This application is based upon and claims the benefit of priority from the prior Japanese Patent Application No. 2016-008017 filed on Jan. 19, 2016 in Japan, the entire contents of which are incorporated herein by reference.

BACKGROUND OF THE INVENTION

Field of the Invention

Embodiments of the present invention relate generally to a multi charged particle beam exposing method and a multi charged particle beam exposing apparatus, and more specifically, for example, to a beam irradiation method in multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" patterns on a wafer and the like with electron beams.

As a known example of employing the electron beam writing technique, there is a writing apparatus using multibeams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun pass through a corresponding hole of a plurality of holes in a mask, performs blanking control for each beam, reduces each unblocked beam by an optical system, and deflects it by a deflector so as to irradiate a desired position on a target object or "sample".

In multi-beam writing, the dose of each beam is individually controlled based on an irradiation time. A control circuit for performing an individual control is included in a blanking aperture array apparatus. The irradiation time of each beam is individually generated as N-bit irradiation time data. A beam ON time of each beam is controlled by individually counting a clock period by using an N-bit control circuit arranged for each beam.

FIG. 12 shows an example of relation among the number of counter bits, multiplicity, and a data transmission amount. The comparative example 1 in FIG. 12 shows the case where an N-bit control circuit is arranged for each beam of multibeams, and an exposure is performed with the multiplicity 1 of exposing times by using N-bit irradiation time data, for example. However, as the number of beams of multi-beams increases, the pitch between beams becomes narrower. Moreover, if the number of bits used in the control circuit increases, the size of the circuit itself also increases in proportion to the number of bits. Therefore, if the number of bits (N bits) used as irradiation time data becomes large, it will be difficult to arrange the N-bit control circuit for each beam. Actually, with the increase in the number of beams of multi-beams, it has become difficult to define a required irradiation time by using n bits being the number of bits with which the control circuit can be arranged. Therefore, it may be possible to reduce an irradiation time and increase the number of times of irradiation (multiplicity m) to compensate the reduction so that the irradiation time can be defined based on n (n<N) bits being the number of bits with which the control circuit can be arranged. When a required irradiation time can be defined by 1023 gray levels (N=10 bits) at maximum, for example, if the number of bits, n, of the control circuit to control an irradiation time is defined using n=N (10 bits), for example, as shown in the comparative example 1 of FIG. 12, it becomes possible to define the irradiation time up to 1023 gray levels at maximum. Therefore, the required irradiation time can be exposed with multiplicity m=1. The data transmission amount in that case is N×m=10 bits. However, as described above, with the increase in the number of beams, it is becoming difficult to arrange the N-bit control circuit. On the other hand, as shown in the comparative example 2 of FIG. 12, if the number of bits, n, of the control circuit to control an irradiation time is defined by, for example, 5 bits, the irradiation time can be defined up to 31 gray levels at maximum. However, for acquiring an irradiation time nearly equivalent to 10 bits, multiple exposures of 32 times (multiplicity m=32) are needed. Even in such a case, the irradiation time can be merely defined up to 960 gray levels at maximum as the total of multiple exposures of 32 times. However, since 5 bits are needed for irradiation time data for one irradiation, the data transmission amount is n×m=5 bits×32 times=160 bits. Thus, when multiple exposures are performed, there is a problem in that the data transmission amount increases.

With respect to the above, there is proposed a method of controlling an irradiation time not by individually counting the irradiation time for each beam, but by dividing a shot of a maximum irradiation time irradiating the same position into a plurality of irradiation steps which are common to all the beams of multi-beams and each of which has a different irradiation time, selecting for each beam only a required irradiation step from a plurality of irradiation steps, and making a beam ON only at the selected irradiation step in order to control, for each beam, the irradiation time based on a total of combination of irradiation steps of beam ON (for example, refer to Japanese Patent Application Laid-open No. 2015-002189). This method employs a control system of controlling ON or OFF based on a timing signal for each irradiation step, without mounting a counter circuit in the blanking aperture array apparatus.

The problem described above with respect to the control method of the irradiation time of each beam of multi-beams is not limited to a writing apparatus, and may occur in any apparatus which performs exposure by irradiating a target object with multi-beams.

BRIEF SUMMARY OF THE INVENTION

According to one aspect of the present invention, a multi charged particle beam exposing method includes setting, in multiple exposures by a plurality of shots of each beam of multi-beams where the plurality of shots continuously irradiate a same irradiation position, a plurality of clock periods including at least one different clock period where the plurality of clock periods individually control an irradiation time of the each beam of the multi-beams such that a clock period of at least one exposure processing differs from clock periods of other exposure processing, and exposing respective corresponding irradiation positions on a target object with the multi-beams by controlling, in each exposure processing of the multiple exposures, the irradiation time in exposure processing concerned using a clock period which has been set in the plurality of clock periods including the at least one different clock period.

According to another aspect of the present invention, a multi charged particle beam exposing apparatus includes a stage configured to mount a target object thereon, a setting processing circuitry configured to set, in multiple exposures by a plurality of shots of each beam of multi-beams where the plurality of shots continuously irradiate a same irradiation position, a plurality of clock periods including at least one different clock period where the plurality of clock periods individually control an irradiation time of the each beam of the multi-beams such that a clock period of at least one exposure processing differs from clock periods of other exposure processing, a clock generator configured to generate a reference clock, a divider configured to generate the at least one different clock period, a blanking aperture array mechanism configured to control, in each exposure processing, the irradiation time of the multi-beams in exposure processing concerned using a clock period which has been set in the plurality of clock periods including the at least one different clock period, and an optical system configured to focus, in the each exposure processing, the multi-beams to form an image on the target object whose irradiation time in the exposure processing concerned is controlled using the clock period which has been set in the plurality of clock periods including the at least one different clock period.

BRIEF DESCRIPTION OF THE DRAWINGS

FIG. 9 shows an example of a content of each irradiation step and a data transmission amount according to the first embodiment;

FIG. 10 shows another example of a content of each irradiation step and a data transmission amount according to the first embodiment;

FIG. 12 shows an example of relation among the number of counter bits, multiplicity, and a data transmission amount.

DETAILED DESCRIPTION OF THE INVENTION

First Embodiment

A first embodiment below describes a multi-beam exposing method and apparatus that can control a required irradiation time while suppressing data transmission amount increase in multi-beam exposure for multiple exposures.

In the first embodiment below, there will be described a configuration in which an electron beam is used as an example of a charged particle beam. The charged particle beam is not limited to the electron beam, and other charged particle beam such as an ion beam may also be used. Moreover, in the Embodiment, the configuration using a writing apparatus as an example of an exposing apparatus will be described. However, the exposing apparatus is not limited to the writing apparatus, and may be an exposing apparatus, such as an inspection apparatus, which irradiates a target object with charged particle beams.

Figure 1:
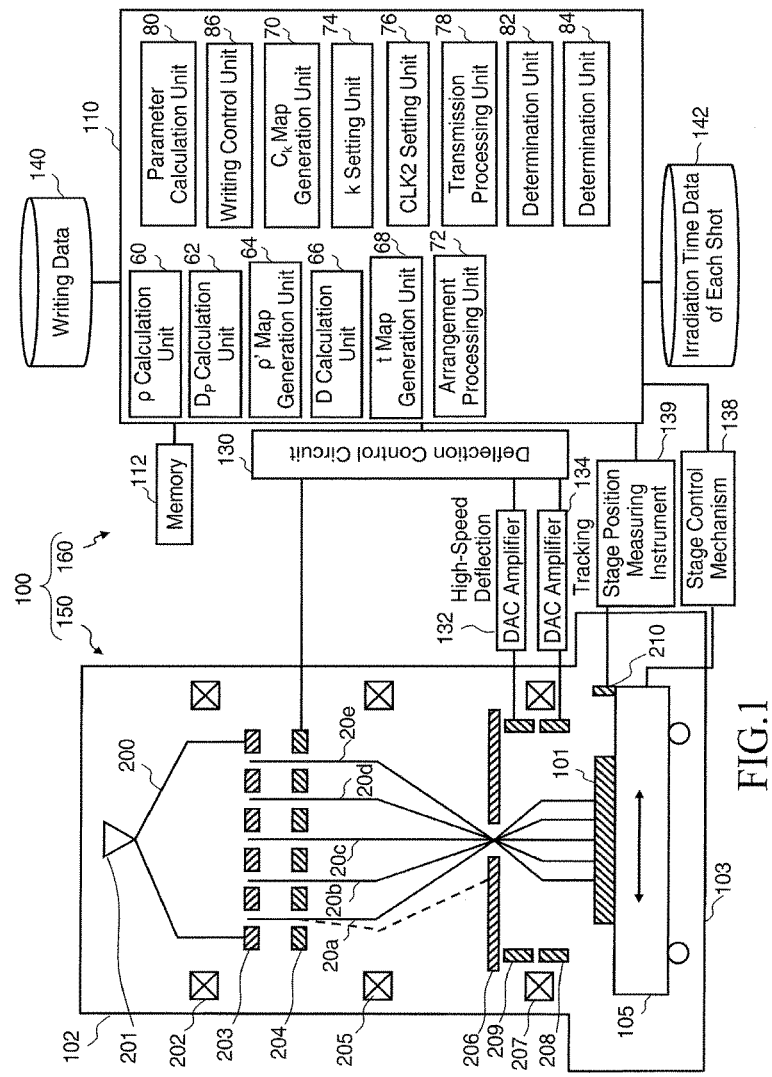
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing unit 150 and a control unit 160. The writing apparatus 100 is an example of a multi charged particle beam writing apparatus and an example of a multi charged particle beam exposing apparatus. The writing unit 150 includes an electron optical column 102 and a writing chamber 103. In the electron optical column 102, there are arranged an electron gun 201, an illumination lens 202, a forming aperture array member 203, a blanking aperture array mechanism 204, a reducing lens 205, a limiting aperture member 206, an objective lens 207, and deflectors 208 and 209. In the writing chamber 103, an XY stage 105 is arranged. On the XY stage 105, a target object or "sample" 101 such as a mask serving as a writing target substrate is placed when writing (exposing) is performed. The target object 101 is, for example, an exposure mask used for manufacturing semiconductor devices, or a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 is arranged on the XY stage 105.

The control circuit 160 includes a control computer 110, a memory 112, a deflection control circuit 130, DAC (digital-analog converter) amplifier units 132 and 134, a stage control mechanism 138, a stage position measuring instrument 139, and storage devices 140 and 142 such as magnetic disk drives. The control computer 110, the memory 112, the deflection control circuit 130, the stage control mechanism 138, the stage position measuring instrument 139, and the storage devices 140 and 142 are connected with each other through a bus (not shown). Writing data is input from the outside of the writing apparatus 100 into the storage device 140 (storage unit) and stored therein. The deflection control circuit 130 is connected to the DAC amplifier units 132 and 134, and the blanking aperture array mechanism 204 through a bus (not shown). The stage position measuring instrument 139 irradiates the mirror 210 on the XY stage 105 with a laser beam, and receives a catoptric light from the mirror 210. Then, the stage position measuring instrument 139 measures the position of the XY stage 105 by using information of the catoptric light.

In the control computer 110, there are arranged a pattern area density ρ calculation unit 60, a proximity effect correction irradiation coefficient $D_p$ calculation unit 62, a pattern-area-density-ρ'-in-pixel map generation unit 64, a dose D calculation unit 66, an irradiation time t map generation unit 68, a count value $C_k$ map generation unit 70, an array processing unit 72, an irradiation step ordinal number k setting unit 74, a clock CLK2 setting unit 76, a transmission processing unit 78, a parameter calculation unit 80, a determination unit 82, a determination unit 84, and a writing control unit 86. Each of " . . . units" such as the pattern area density ρ calculation unit 60, the proximity effect correction irradiation coefficient $D_p$ calculation unit 62, the pattern-area-density-ρ'-in-pixel map generation unit 64, the dose D calculation unit 66, the irradiation time t map generation unit 68, the count value $C_k$ map generation unit 70, the array processing unit 72, the irradiation step ordinal number k setting unit 74, the clock CLK2 setting unit 76, the transmission processing unit 78, the parameter calculation unit 80, the determination unit 82, the determination unit 84, and the writing control unit 86 includes a processing circuitry. As the processing circuitry, for example, an electric circuit, computer, processor, circuit board, quantum circuit, semiconductor device, or the like can be used. Each " . . . unit" may use a common processing circuitry (same processing circuitry), or different processing circuitries (separate processing circuitries). Data which is input and output to/from the pattern area density ρ calculation unit 60, the proximity effect correction irradiation coefficient $D_p$ calculation unit 62, the pattern-area-density-ρ'-in-pixel map generation unit 64, the dose D calculation unit 66, the irradiation time t map generation unit 68, the count value $C_k$ map generation unit 70, the array processing unit 72, the irradiation step ordinal number k setting unit 74, the clock CLK2 setting unit 76, the transmission processing unit 78, the parameter calculation unit 80, the determination unit 82, the determination unit 84, and the writing control unit 86, and data being operated are stored in the memory 112 each time.

FIG. 1 shows configuration elements necessary for describing the first embodiment. It should be understood that other configuration elements generally necessary for the writing apparatus 100 may also be included therein.

Figure 2:
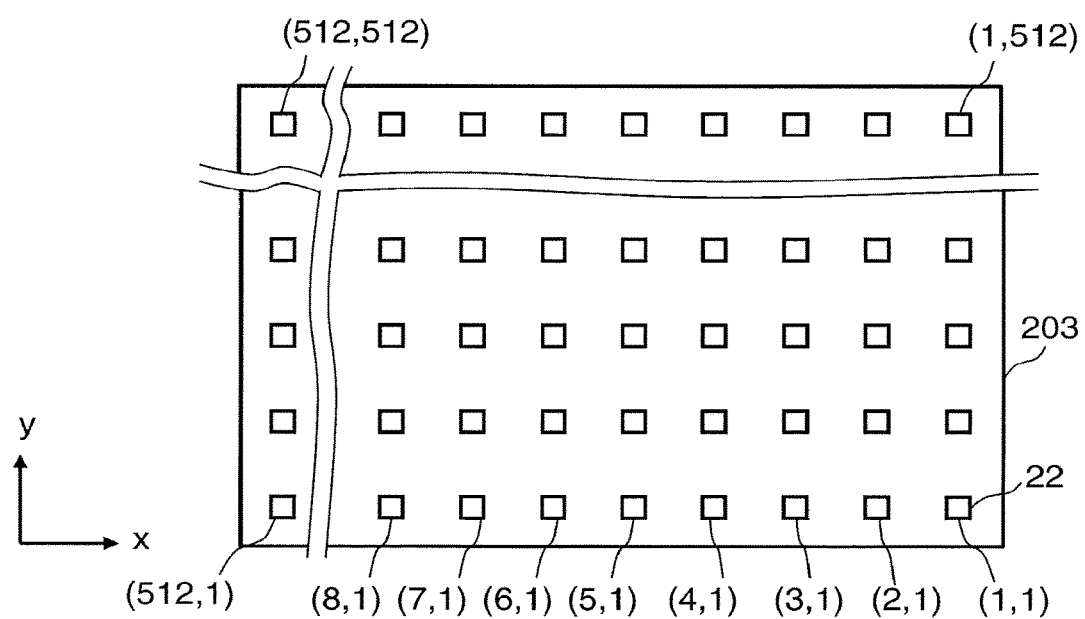
FIG. 2 is a conceptual diagram showing a configuration of a forming aperture array member according to the first embodiment.

FIG. 2 is a conceptual diagram showing a configuration of a forming aperture array member according to the first embodiment. As shown in FIG. 2, holes (openings) 22 of p rows long (y direction) and q columns wide (x direction) (p≥2, q≥2) are formed, like a matrix, at a predetermined arrangement pitch in the forming aperture array member 203. In FIG. 2, for example, holes 22 of 512 (rows in y direction)×512 (columns in x direction) are formed. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
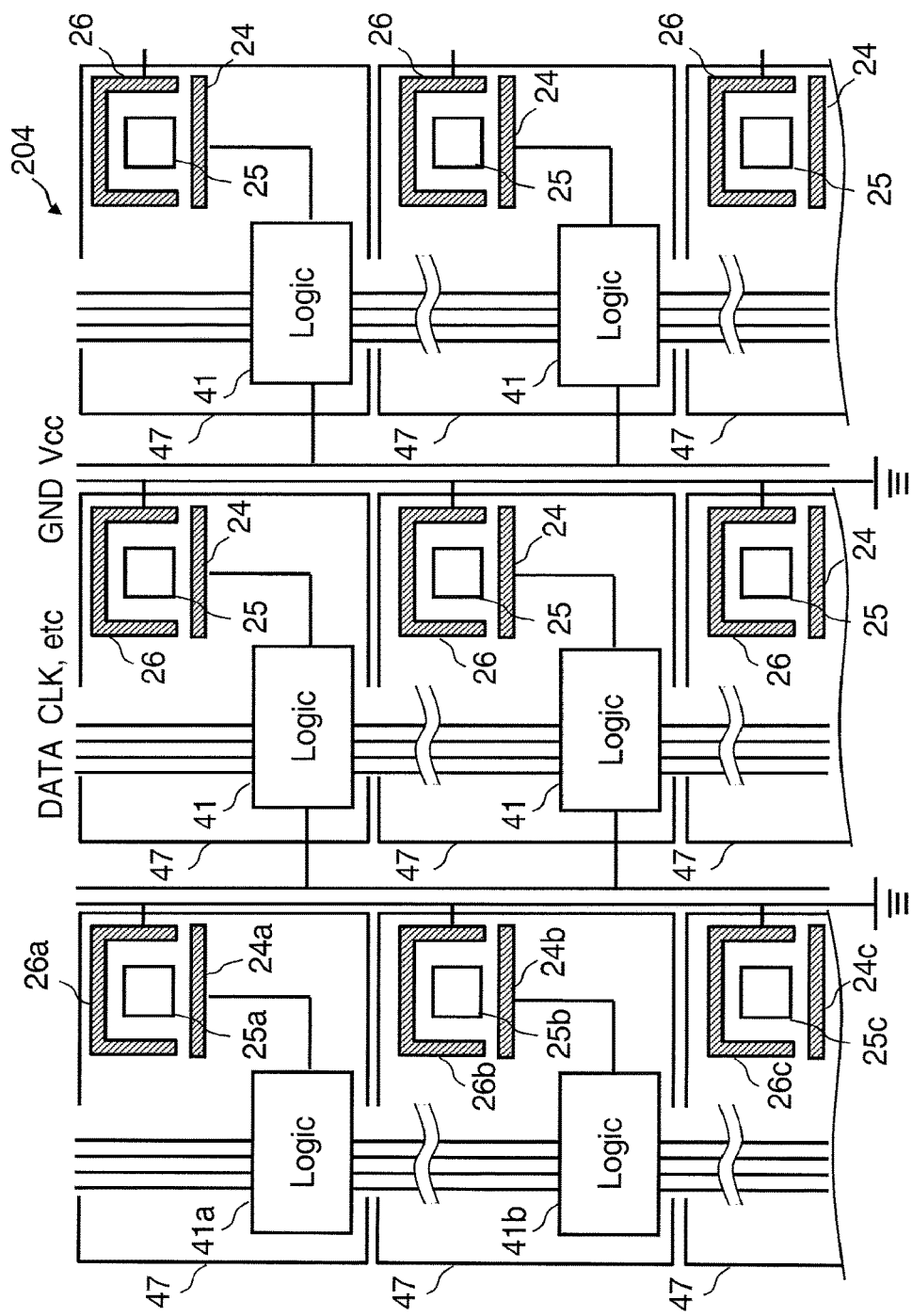
FIG. 3 is a top view conceptual diagram showing a part of a blanking aperture array mechanism according to the first embodiment.

FIG. 3 is a top view conceptual diagram showing a part of a blanking aperture array mechanism according to the first embodiment. In FIG. 3, the positional relation of electrodes 24 and 26 and the positional relation of a control circuit 41 are not in accordance with each other. As shown in FIG. 3, in the blanking aperture array mechanism 204, there are formed passage holes 25 (openings), through which multiple beams individually pass, at the positions each corresponding to each hole 22 of the forming aperture array member 203 of FIG. 2. Then, a pair of electrodes 24 and 26 (blanker: blanking deflector) for blanking deflection is arranged close to each passage hole 25 in a manner such that the electrodes 24 and 26 are opposite each other with respect to the passage hole 25 concerned. Moreover, close to each passage hole 25, there is arranged the control circuit 41 (logic circuit) for applying a deflection voltage to, for example, the electrode 24 for each passage hole 25. The other one (the electrode 26, for example) of the two electrodes 24 and 26 for each beam is grounded (earthed). Further, for example, an n-bit line for control signal is connected to each control circuit 41. In addition to the n-bit line, for example, a clock signal line, a power source line, and the like are connected to each control circuit 41. An individual blanking system 47 composed of the electrodes 24 and 26 and the control circuit 41 is configured for each beam of multi-beams. A control signal for each control circuit 41 is output from the deflection control circuit 130. Moreover, a shift register to be described later is arranged in each control circuit 41, and for example, shift registers for beams in one row of p×q multi beams in the control circuit are connected in series. For example, control signals for beams in one row of the p×q multi beams are transmitted in series. For example, a control signal of each beam is stored in a corresponding control circuit 41 by clock signals of q times.

The electron beam 20 passing through a corresponding passage hole is independently deflected by the voltage applied to the two electrodes 24 and 26 being a pair. Blanking control is performed by this deflection. Blanking deflection is performed for each corresponding beam of the multi-beams. Thus, each of a plurality of blankers performs blanking deflection of a corresponding beam of the multi-beams having passed through a plurality of holes 22 (openings) of the forming aperture array member 203.

Figure 4:
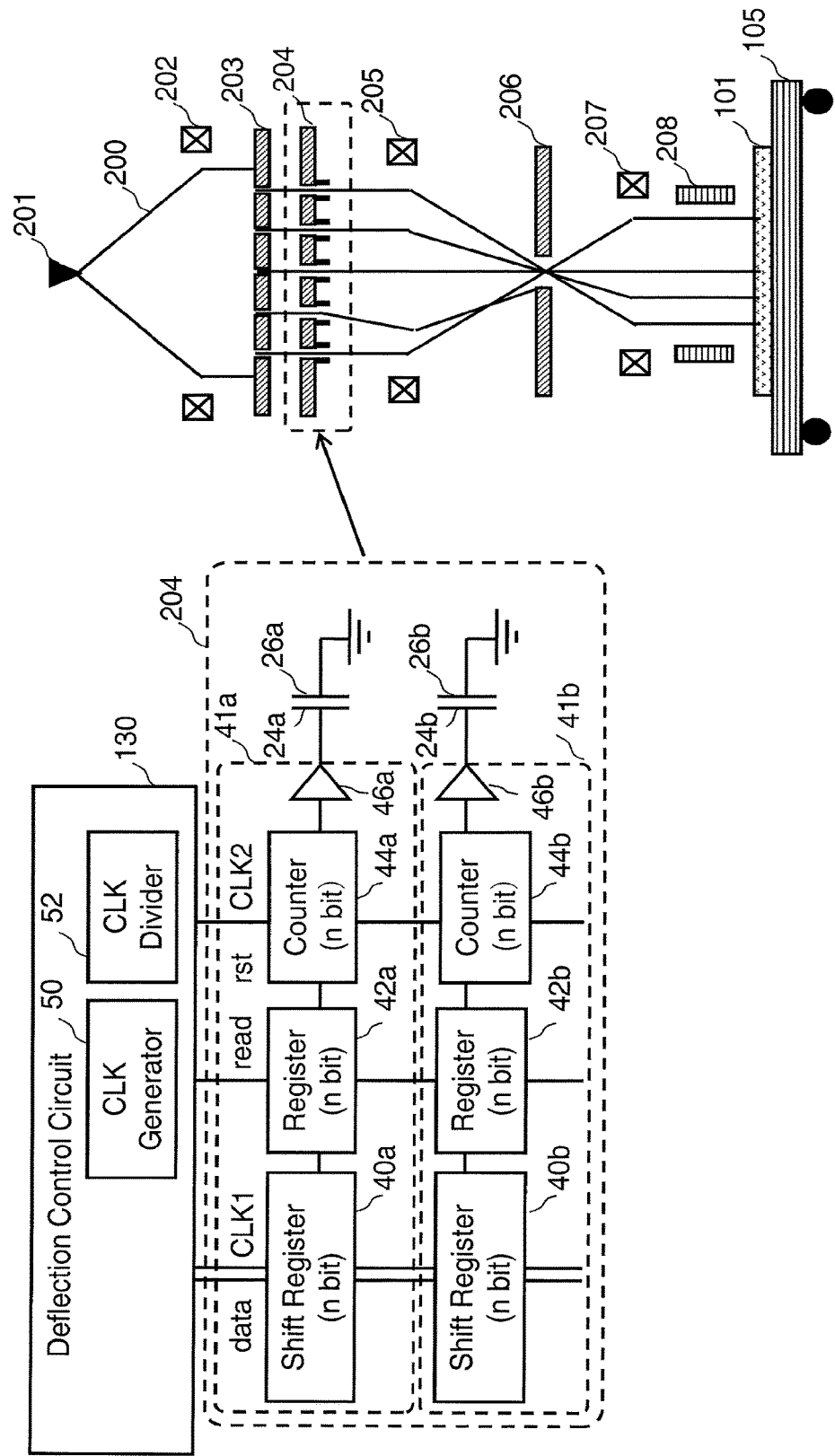
FIG. 4 shows a part of an example of the configuration in the deflection control circuit, and an example of the configuration of the control circuit in the blanking aperture array mechanism according to the first embodiment.

FIG. 4 shows a part of an example of the configuration in the deflection control circuit, and an example of the configuration of the control circuit in the blanking aperture array mechanism according to the first embodiment. The electrodes 24 and 26 in the blanking aperture array mechanism 204 may be arranged at the lower surface side as shown in FIG. 4. In FIG. 4, an n-bit control shift register 40, an n-bit control register 42, an n-bit control counter 44, and an amplifier 46 are arranged in each control circuit 41 for controlling individual blanking arranged in the blanking aperture array mechanism 204 in the body of the writing apparatus 100. The case of FIG. 4 shows the situation where control circuits 41a and 41b are used for two beams a and b as examples of p×q multi-beams. In the deflection control circuit 130, as a part of the configuration, there arranged a clock CLK generator 50 which generates a reference control clock signal CLK1, and a clock CLK divider 52 which generates a second control clock signal CLK2 having been changed. According to the first embodiment, although N bits are needed for irradiation time data for defining the irradiation time of a shot of one beam, the control circuit 41 performs controlling using n bits smaller than N bits. That is, a control signal of n bits smaller than N bits is input/output to/from the shift register 40, the register 42, and the counter 44. Since the amount of information of the control signal is small, the installation area of the control circuit can be made small. In other words, even when the control circuit 41 is arranged in the blanking aperture array mechanism 204 whose installation space is small, more beams can be arranged at a smaller beam pitch. This increases the amount of current passing through the blanking aperture array mechanism 204, and therefore, improves the writing throughput.

According to the first embodiment, blanking control of each beam is performed by beam ON/OFF control by each control circuit 41 for individual blanking control described above.

Figure 5:
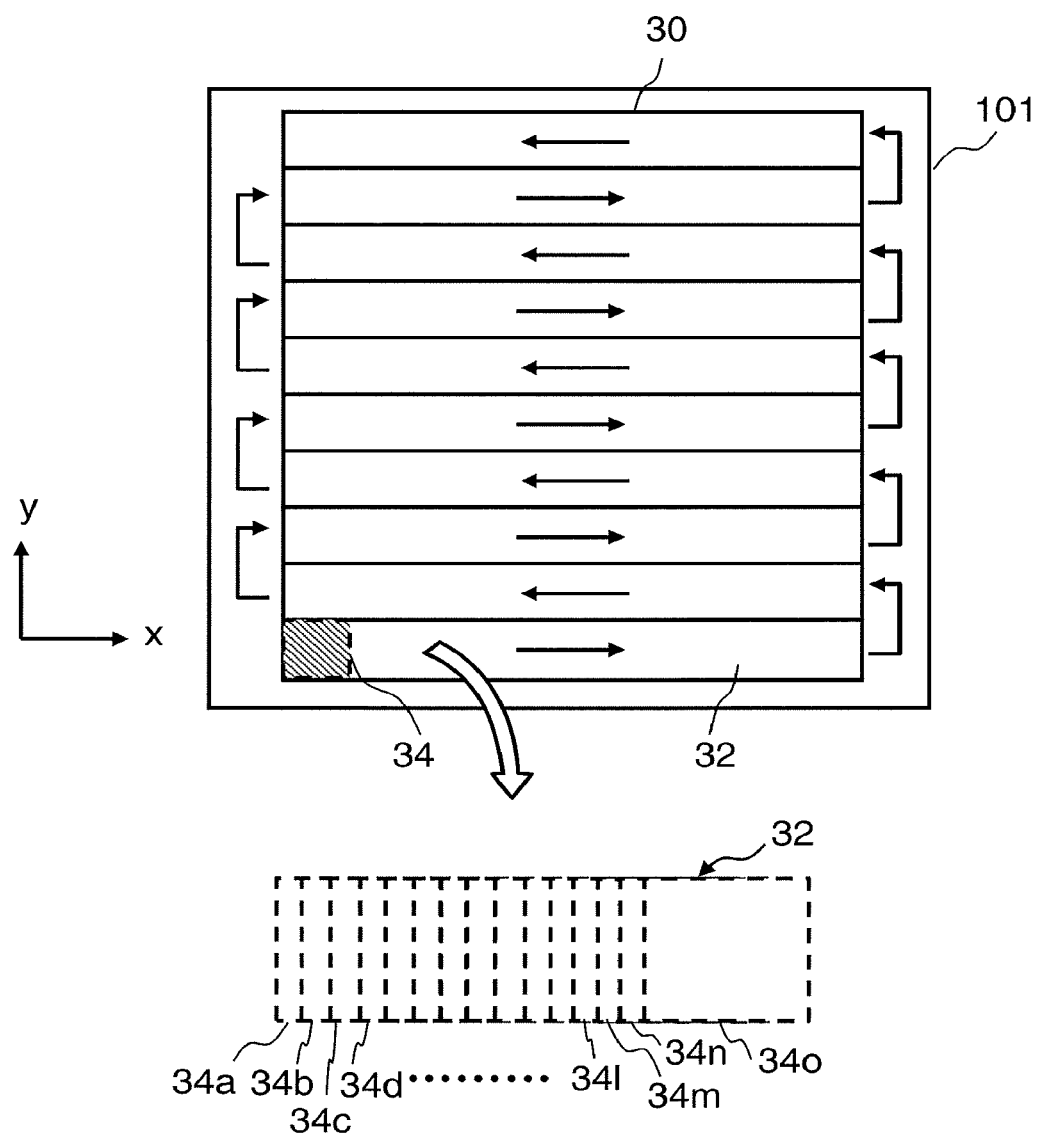
FIG. 5 is a conceptual diagram explaining an example of a writing operation according to the first embodiment.

FIG. 5 is a conceptual diagram explaining an example of a writing operation according to the first embodiment. As shown in FIG. 5, a writing region 30 of the target object 101 is virtually divided by a predetermined width or "height" (to be a stripe width) in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position more left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position more right than the right end and located relatively in the y direction. Then, by moving the XY stage 105 in the x direction, for example, writing similarly advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. A plurality of shot patterns, whose number is equal to the number of the holes 22 at the maximum, are formed at a time by one shot (total of irradiation steps to be described later) of multi-beams which have been formed by passing through each of the holes 22 of the forming aperture array member 203.

Figure 6:
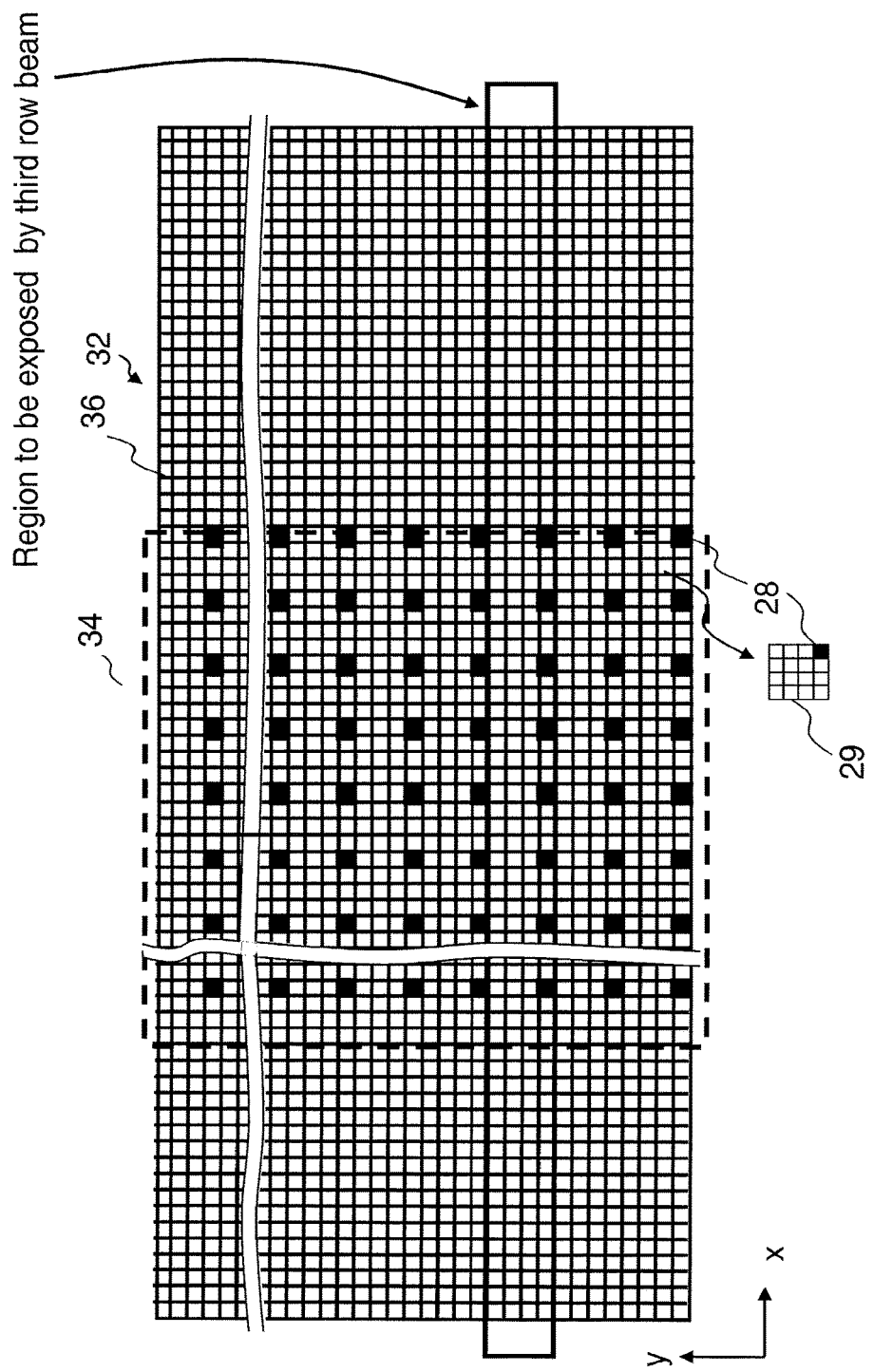
FIG. 6 shows an example of an irradiation region of multi-beams and a pixel to be written (writing target pixel) according to the first embodiment.

FIG. 6 shows an example of an irradiation region of multi-beams and a pixel to be written (writing target pixel) according to the first embodiment. In FIG. 6, the stripe region 32 is divided into a plurality of mesh regions by the size of each beam of the multi-beams, for example. Each mesh region serves as a writing target pixel 36 (unit irradiation region, or writing position). The size of the writing target pixel 36 is not limited to the beam size, and it may be an arbitrary size regardless of the beam size. For example, it may be 1/n (n being an integer of 1 or more) of the beam size. FIG. 6 shows the case where the writing region of the target object 101 is divided in the y direction into a plurality of stripe regions 32 by the width size being substantially the same as the size of the irradiation region 34 (writing field) which can be irradiated by one shot of the multi-beams 20, for example. The width of the stripe region 32 is not limited to this. It is also preferable for the width of the stripe region 32 to be n times (n being an integer of 1 or more) the size of the irradiation region 34. FIG. 6 shows the case of multi-beams of 512×512 (rows by columns). In the irradiation region 34, there are shown a plurality of pixels 28 (writing positions of beams) which can be irradiated by one shot of the multi-beams 20. In other words, the pitch between the adjacent pixels 28 is the pitch between beams of the multi-beams. In the example of FIG. 6, one grid 29 is a square region surrounded at four corners by four adjacent pixels 28, and including one of the four pixels 28. In the example of FIG. 6, each grid 29 is configured by 4×4 pixels.

Figure 7:
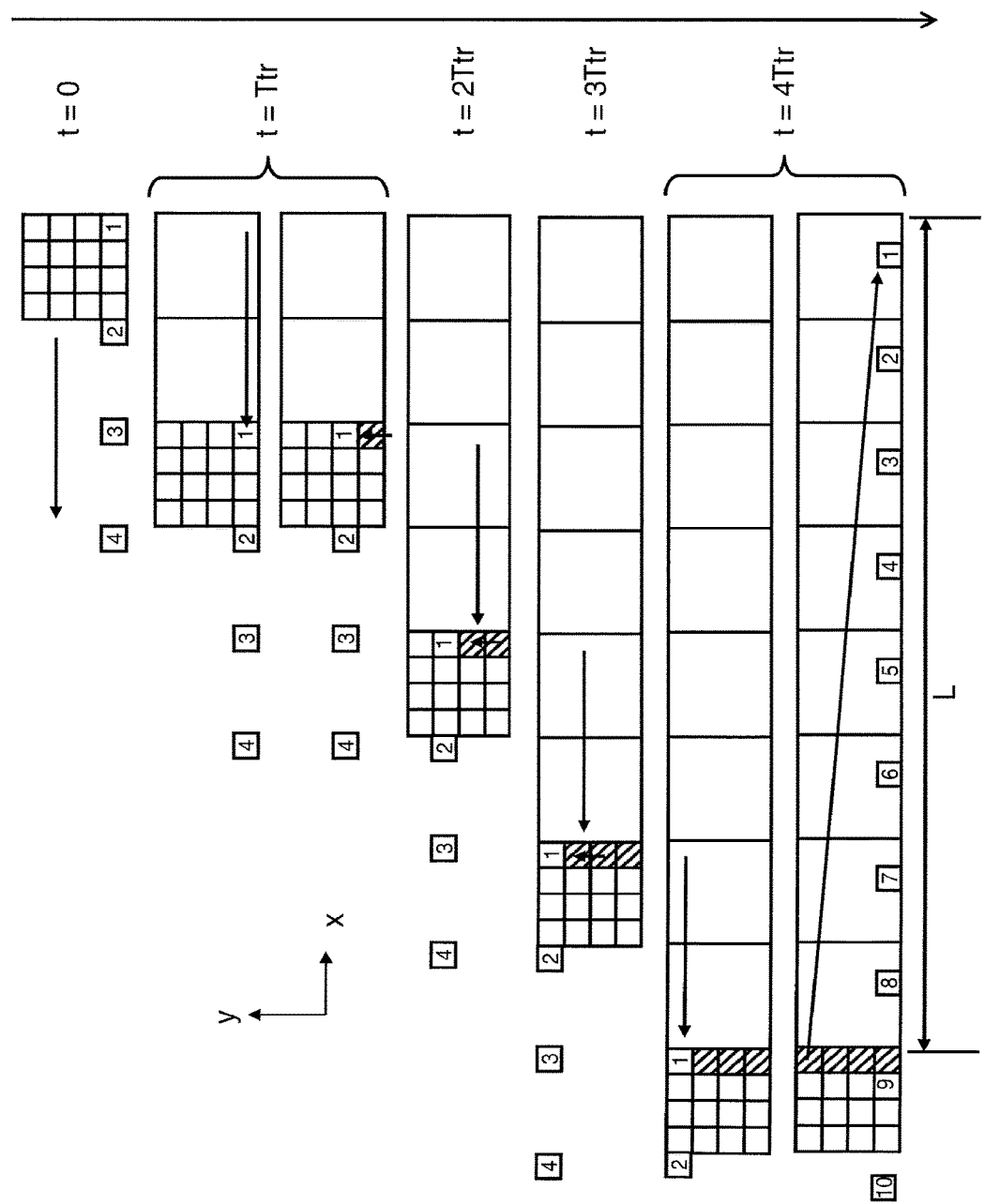
FIG. 7 illustrates an example of a writing method of multi-beams according to the first embodiment.

FIG. 7 illustrates an example of a writing method of multi-beams according to the first embodiment. FIG. 7 shows some grids to be written by respective beams at the coordinates (1, 3), (2, 3), (3, 3), . . . , (512, 3) in the third row from the bottom in the y direction in the multi-beams for writing the stripe region 32 shown in FIG. 6. In the example of FIG. 7, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multi-beams 20 by the deflector 208. In other words, tracking control is performed. In the example of FIG. 7, one tracking cycle is executed by writing (exposing) four pixels while moving the distance of eight beam pitches.

Specifically, the stage position measuring instrument 139 measures the position of the XY stage 105 by irradiating the mirror 210 with a laxer and receiving a catoptric light from the mirror 210. The measured position of the XY stage 105 is output to the control computer 110. In the control computer 110, the writing control unit 86 outputs the position information on the XY stage 105 to the deflection control circuit 130. The deflection control circuit 130 calculates deflection amount data (tracking deflection data) for performing beam deflection to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing unit 150 irradiates each pixel 36 with a corresponding beam in the ON state in the multi-beams 20 during a writing time (irradiation time or exposure time) corresponding to each pixel 36 within the maximum writing time Ttr of the irradiation time of each beam of the multi-beams of the shot concerned (total of a plurality of irradiation steps (multiple exposures) to be described later). According to the first embodiment, one shot is divided into a plurality of irradiation steps (irradiation steps of a plurality of times) to be described later, and the plurality of irradiation steps (multiple exposures) are performed continuously for the same pixel 36 during one shot operation. First, a plurality of irradiation steps is regarded as one shot, and the operation of each shot is described below.

In the example of FIG. 7, during from the time t=0 to t=Ttr being the maximum writing time, using a beam (1) of coordinates (1, 3), beam irradiation of the first shot composed of a plurality of irradiation steps (multiple exposures) is performed to the first pixel from the right in the bottom row of the grid 29 concerned. The XY stage 105 moves, for example, two beam pitches in the −x direction during from the time t=0 to t=Ttr. During this time period, the tracking operation is continuously performed.

After the maximum writing time Ttr of the shot concerned has passed since the start of beam irradiation of the shot concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 7, when the time becomes t=Ttr, the pixel to be written (writing target pixel) is shifted from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continued, respective beams in the ON state in the multi-beams 20 are applied to shifted writing positions corresponding to the respective beams during a writing time corresponding to each of the respective beams within a maximum writing time Ttr of the shot concerned. In the example of FIG. 7, the first pixel from the right in the second row from the bottom of the grid 29 concerned is irradiated by the second shot using the beam (1) of coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 7, when the time becomes t=2Ttr, the pixel to be written (writing target pixel) is shifted from the first pixel from the right in the second row from the bottom of the grid 29 concerned to the first pixel from the right in the third row from the bottom by collectively deflecting the multi-beams by the deflector 209. Since the XY stage 105 is moving also during this time period, the tracking operation is continuously performed. Then, the first pixel from the right in the third row from the bottom of the grid 29 concerned is irradiated by the third shot using the beam (1) of coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the pixel to be written (writing target pixel) is shifted from the first pixel from the right in the third row from the bottom of the grid 29 concerned to the first pixel from the right in the fourth row from the bottom by collectively deflecting the multi-beams by the deflector 209. Since the XY stage 105 is moving also during this time period, the tracking operation is continuously performed. Then, the first pixel from the right in the fourth row from the bottom of the grid 29 concerned is irradiated by the fourth shot using the beam (1) of coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. By the process described above, writing of the pixels in the first column from the right of the grid 29 concerned has been completed.

In the example of FIG. 7, after emitting a corresponding beam while switching the beam to the writing position of each beam which has been shifted three times from the initial position, the DAC amplifier 134 returns the tracking position to the start position of tracking where the tracking control was started, by resetting the beam deflection for tracking control.

In other words, the tracking position is returned in the opposite direction to the direction of the stage movement. In the example of FIG. 7, when the time becomes t=4Ttr, tracking of the grid 29 concerned is released (removed), and the beam is swung back to a new target grid which has been shifted by eight beam pitches in the x direction. Although the beam (1) of the coordinates (1,3) has been described in the example of FIG. 7, writing is also similarly performed for each grid corresponding to a beam of other coordinates. That is, a beam of coordinates (n, m) completes writing of pixels in the first column from the right of a corresponding grid when the time becomes t=4Ttr. For example, a beam (2) of coordinates (2,3) completes writing of pixels in the first column from the right of a grid adjacent in the −x direction to the grid 29 concerned for the beam (1) of FIG. 7.

Since writing of the pixels in the first column from the right of each grid has been completed, in a next tracking cycle after resetting the tracking, the deflector 209 performs deflection such that the writing position of each corresponding beam is adjusted (shifted) to the second pixel from the right in the first row from the bottom of each grid.

As described above, each shot (a plurality of irradiation steps (multiple exposures)) is performed while shifting the irradiation position pixel by pixel by the deflector 209, in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 5, the first shot position is adjusted to be the position shifted by one pixel, for example. Then, while performing a next tracking control, each shot is performed shifting the irradiation position by one pixel by the deflector 209. By repeating this operation during writing the stripe region 32, the position of the irradiation region 34 is shifted one by one, such as from 34a to 34o, to perform writing of the stripe region concerned.

Figure 8:
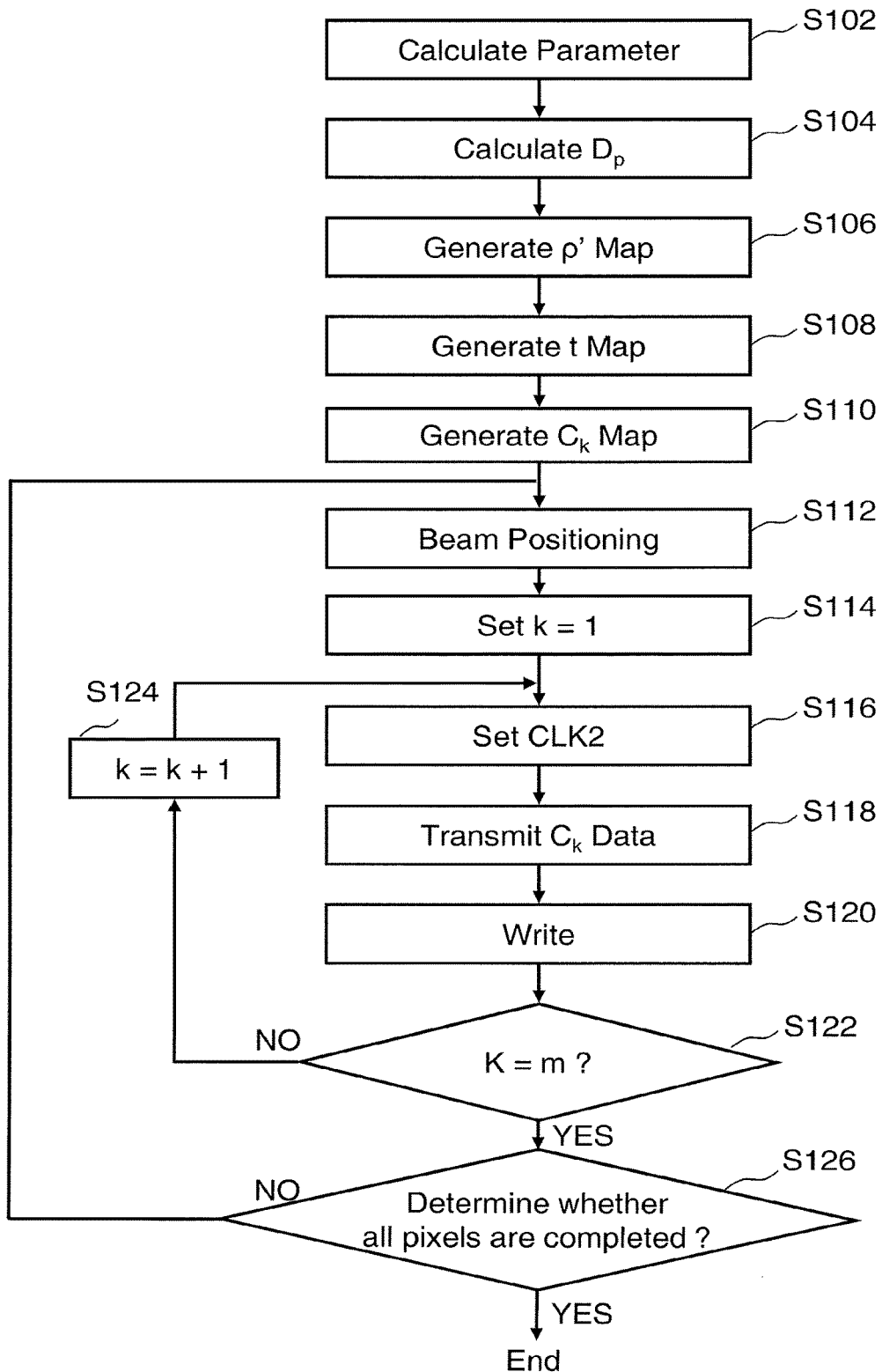
FIG. 8 is a flowchart showing main steps of a writing method according to the first embodiment.

FIG. 8 is a flowchart showing main steps of a writing method according to the first embodiment. As shown in FIG. 8, the writing method according to the first embodiment executes a series of steps: a parameter calculation step (S102), a proximity effect correction irradiation coefficient $D_p$ calculation step (S104), a pattern-area-density-ρ'-in-pixel map generation step (S106), an irradiation time t map generation step (S108), a count value $C_k$ map generation step (S110), a beam positioning step (S112), an irradiation step ordinal number k setting step (S114), a clock CLK2 setting step (S116), a data transmission step (S118), a writing step (S120), a determination step (S122), an irradiation step ordinal number k change step (S124), and a determination step (S126).

In the parameter calculation step (S102), the parameter calculation unit 80 calculates parameters for performing writing processing. According to the first embodiment, for each beam, one shot of multi-beams which is indicated by irradiation time data defined by N bits is divided into m irradiation steps (irradiation steps of m times, namely, each irradiation step is each exposure processing of multiple exposures). In such case, in at least one irradiation step, a clock period (cycle) for control is changed. Here, as parameters, m being the number of times (number of divisions) of the irradiation step, $n_k$ being the number of control bits in each irradiation step, and $\Delta t_k$ being a clock period for control in each irradiation step are calculated.

First, the parameter calculation unit 80 reads N being the number of bits of irradiation time data defining the irradiation time of one shot of multi-beams. N, the number of bits, is preferably set in the writing apparatus 100 in advance. Alternatively, it is preferably defined as parameter information in writing data stored in the storage device 140 in order to be read out.

Next, the parameter calculation unit 80 reads $n_{BAA}$ being the number of control bits of the counter 44 of the control circuit 41 for individual beam control mounted in the blanking aperture array mechanism 204, and calculates m being the number of times (number of divisions) of the irradiation step. m being the number of times (number of divisions) of the irradiation step is defined as an integer obtained by rounding up digits after the decimal point of a value calculated by dividing the number of bits, N, of irradiation time data by the number of control bits, $n_{BAA}$, of the counter 44 of the control circuit 41. m, the number of times (number of divisions) of the irradiation step, is defined by the following equation (1).

$$m = \text{ROUNDUP}(N/n_{BAA}, 0) \quad (1)$$

Next, the parameter calculation unit 80 calculates $n_k$ being the number of control bits in each irradiation step. As a condition for the number of control bits, $n_k$, in each irradiation step, $n_k$ should be equal to or less than the number of control bits, $n_{BAA}$. That is, $n_k$, the number of control bits in each irradiation step satisfies the following equation (2). Moreover, it is preferable that the total of $n_k$, namely, the total of the number of control bits of all the irradiation steps that divide one shot of multi-beams is set to be the number of bits, N, of irradiation time data defining the irradiation time of one shot of multi-beams. In other words, it is preferable if the total value of $n_k$, namely, the total value of the number of bits of irradiation time data defining the irradiation time of each exposure processing in multiple exposures is the number of bits, N, of irradiation time data defining a settable maximum value of the irradiation time. That is, the number of control bits, $n_k$, in each irradiation step preferably satisfies the following equation (3).

$$n_k \le n_{BAA} \quad (2)$$

$$\Sigma n_k = N \quad (3)$$

However, as long as the equation (2) is satisfied, it is acceptable with respect to the equation (3) that the total of $n_k$, namely, the total of the number of control bits of all the irradiation steps that divide one shot of multi-beams is larger than N being the number of bits of irradiation time data defining the irradiation time of one shot of multi-beams. Although the data transmission amount increases slightly in that case, a large reduction of the data transmission amount can be achieved compared to the conventional multiple exposing method (comparative example 2).

Next, the parameter calculation unit 80 calculates a control clock period $\Delta t_k$ used in each irradiation step. A control clock period $\Delta t_1$ used in one irradiation step is defined by a reference clock period $\Delta$ ($\Delta$=1/reference clock CLK1). A control clock period $\Delta t_k$ to be used in a next irradiation step is defined by the following equation (4) using a control clock period $\Delta t_{k-1}$ and the number of control bits, $n_{k-1}$, used in the last previous irradiation step.

$$\Delta t_k = 2^{n_{k-1}} \cdot \Delta t_{k-1} \quad (4)$$

Thus, with respect to a plurality of clock periods, IL is set such that a value obtained by dividing a long clock period by a short clock period is a power of 2.

FIG. 9 shows an example of a content of each irradiation step and a data transmission amount according to the first embodiment. FIG. 9 illustrates the case where the number of bits with which time can be controlled by the control circuit 41 for individual beam control mounted in the blanking aperture array mechanism 204 is 5 bits, for example. Specifically, FIG. 9 shows the case where the number of control bits, $n_{BAA}$, of the counter 44 of the control circuit 41 for individual beam control is 5 bits, and where the number of bits, N, of the irradiation time data defining the irradiation time of one shot of multi-beams is 10 bits. In the example of FIG. 9, m being the number of times (number of divisions) of the irradiation step is ROUNDUP (10/5, 0)=2 by the equation (1). Therefore, the irradiation time of one shot of multi-beams is divided into two irradiation steps (multiple exposures). The number of control bits, $n_1$, in the first irradiation step of the two irradiation steps is 5 bits. The clock period $\Delta t_1$ of the first irradiation step serves as a reference clock period $\Delta$. Since, in the first irradiation step, 5-bit data can be controlled by the reference clock period $\Delta$, it is possible to define the irradiation time which can be defined by 0 to ($2^5$−1) $\Delta$. That is, it is possible to define the irradiation time up to 31$\Delta$ by a value obtained by multiplying 0 (zero) or one of the reference clock periods $\Delta$, 2$\Delta$, 3$\Delta$, . . . , 31$\Delta$ by a multiple of 1. Thereby, with respect to 10 bits of the irradiation time data which is defined by the reference clock period $\Delta$, time corresponding to the last 5 bits can be defined. Therefore, the first 5 bits in the 10-bit irradiation time data remain.

Then, the number of control bits, $n_2$, in the second irradiation step of the two irradiation steps is 5 bits. The clock period $\Delta t_2$ of the second irradiation step is 32$\Delta$ being $2^5$ times the reference clock period $\Delta$. Since, in the second irradiation step, 5-bit data can be controlled by the clock period $\Delta t_2$ (=32$\Delta$) which has been changed, it is possible to define the irradiation time up to 992$\Delta$ which can be defined by a value obtained by multiplying 0 (zero) or one of the reference clock periods 32$\Delta$, 64$\Delta$, 96$\Delta$, . . . , 992$\Delta$ by a multiple of 32. Thus, the range of the irradiation time to be controlled varies depending on a plurality of clock periods.

When the maximum irradiation time of one shot of multi-beams is defined by 10-bit data controlled by the reference clock period $\Delta$, that is, when it is defined by 0 (zero) to 1023 gray levels, the irradiation time of one shot of each beam of multi-beams is defined by 0 to 1023$\Delta$. In the case of FIG. 9, in the second irradiation step, beam irradiation is performed based on the irradiation time indicated by the maximum value which can define the irradiation time of each beam by a multiple of 32$\Delta$ in 0 to 1023$\Delta$. Alternatively, if the irradiation time of the beam concerned is less than 32$\Delta$ from the first, it is sufficient that the irradiation time of the second irradiation step should be 0. Then, in the first irradiation step, beam irradiation should be performed based on the irradiation time indicated by the remaining 0 to 15$\Delta$. Thus, by performing such two irradiation steps, the irradiation time of 0 to 1023$\Delta$ can be defined. Since the number of control bits, $n_1$, in the first irradiation step is 5 bits, the data transmission amount is also 5 bits. Moreover, since the number of control bits, $n_2$, in the second irradiation step is 5 bits, the data transmission amount is also 5 bits. Therefore, the data transmission amount of the entire plurality of irradiation steps can be the same as the data transmission amount in the case where the number of bits, N, of the irradiation time data defining the irradiation time of one shot of multi-beams is 10 bits. FIG. 10 shows another example of a content of each irradiation step and a data transmission amount according to the first embodiment. FIG. 10 illustrates the case where the number of bits with which time can be controlled by the control circuit 41 for individual beam control mounted in the blanking aperture array mechanism 204 is 4 bits, for example. Specifically, FIG. 10 shows the case where the number of control bits, $n_{BAA}$, of the counter 44 of the control circuit 41 for individual beam control is 4 bits, and where the number of bits, N, of the irradiation time data defining the irradiation time of one shot of multi-beams is 10 bits. In the example of FIG. 10, m being the number of times (number of divisions) of the irradiation step is ROUNDUP (10/4, 0)=3 by the equation (1). Therefore, the irradiation time of one shot of multi-beams is divided into three irradiation steps (multiple exposures). The number of control bits, $n_1$, in the first irradiation step of the three irradiation steps can be one of 2 to 4 bits in the case of performing definition to satisfy the equations (2) and (3). In the example of FIG. 10, it is defined to be 4 bits. The clock period $\Delta t_1$ of the first irradiation step serves as a reference clock period $\Delta$. Since, in the first irradiation step, 4-bit data can be controlled by the reference clock period $\Delta$, it is possible to define the irradiation time which can be defined by 0 to $(2^4-1)$ $\Delta$. That is, it is possible to define the irradiation time up to $15\Delta$ by a value obtained by multiplying 0 (zero) or one of the reference clock periods $\Delta$, $2\Delta$, $3\Delta$, ..., $15\Delta$ by a multiple of 1. Thereby, with respect to 10 bits of the irradiation time data which is defined by the reference clock period $\Delta$, time corresponding to the last 4 bits can be defined. Therefore, the first 6 bits in the 10-bit irradiation time data remain.

The number of control bits, $n_2$, in the second irradiation step can be one of 2 to 4 bits in the case of performing definition to satisfy the equations (2) and (3). In the example of FIG. 10, it is defined to be 3 bits. The clock period $\Delta t_2$ of the second irradiation step satisfies the equation (4) and is $16\Delta$ being $2^4$ times the reference clock period $\Delta$. Since, in the second irradiation step, 3-bit data can be controlled by the clock period $\Delta t_t$ (=$16\Delta$) which has been changed, it is possible to define the irradiation time up to $112\Delta$ which can be defined by a value obtained by multiplying 0 (zero) or one of the reference clock periods $16\Delta$, $32\Delta$, $48\Delta$, ..., $112\Delta$ by a multiple of 16. Thereby, with respect to 10 bits of the irradiation time data which is defined by the reference clock period $\Delta$, time corresponding to the fifth to seventh bits from the last can be defined. Therefore, the first 3 bits in the 10-bit irradiation time data remain.

The number of control bits, $n_3$, in the third irradiation step is the remaining 3 bits in the case of performing definition to satisfy the equations (2) and (3). The clock period $\Delta t_3$ of the third irradiation step satisfies the equation (4) and is $128\Delta$ being $2^3$ times the clock period $\Delta t_2$, that is, $2^7$ times the reference clock period $\Delta$. Since, in the third irradiation step, the clock period $\Delta t_3$ (=$128\Delta$) which has been changed can treat 3-bit data, it is possible to define the irradiation time up to $896\Delta$ by a value obtained by multiplying 0 (zero) or one of the reference clock periods $128\Delta$, $256\Delta$, $384\Delta$, ..., $896\Delta$ by a multiple of 128. Thus, the range of the irradiation time to be controlled varies depending on a plurality of clock periods. Thereby, with respect to 10 bits of the irradiation time data which is defined by the reference clock period $\Delta$, time corresponding to the first 3 bits can be defined. Therefore, the time corresponding to the 10-bit irradiation time data can be entirely defined.

When the maximum irradiation time of one shot of multi-beams is defined by 10-bit data controlled by the reference clock period $\Delta$, that is, when it is defined by 0 (zero) to 1023 gray levels, the irradiation time of one shot of each beam of multi-beams is defined by 0 to $1023\Delta$. In the case of FIG. 10, in the third irradiation step, beam irradiation is performed based on the irradiation time indicated by the maximum value which can define the irradiation time of each beam by a multiple of $128\Delta$ in 0 to $1023\Delta$. Alternatively, if the irradiation time of the beam concerned is less than $128\Delta$ from the first, it is sufficient that the irradiation time of the third irradiation step should be 0. Then, in the second irradiation step, beam irradiation is performed based on the irradiation time indicated by the maximum value which can define the remaining time (less than $128\Delta$) by a multiple of $16\Delta$. Alternatively, if the irradiation time of the beam concerned is less than $16\Delta$ from the first, it is sufficient that the irradiation time of the second irradiation step should be 0. Then, in the first irradiation step, beam irradiation should be performed based on the irradiation time which indicates the remaining time (less than $16\Delta$) by 0 to $15\Delta$. Thus, by performing such three irradiation steps, the irradiation time of 0 to $1023\Delta$ can be defined. Since the number of control bits, $n_1$, in the first irradiation step is 4 bits, the data transmission amount is also 4 bits. Moreover, since the number of control bits, $n_2$, in the second irradiation step is 3 bits, the data transmission amount is also 3 bits. Further, since the number of control bits, $n_3$, in the third irradiation step is 3 bits, the data transmission amount is also 3 bits. Therefore, the data transmission amount of the entire plurality of irradiation steps can be the same as the data transmission amount in the case where the number of bits, N, of the irradiation time data defining the irradiation time of one shot of multi-beams is 10 bits.

In the light of the above, writing processing is advanced as described below in the first embodiment.

In the proximity effect correction irradiation coefficient $D_p$ calculation step (S104), first, the p calculation unit 60 virtually divides the writing region (here, for example, stripe region 32) into a plurality of proximity mesh regions (mesh regions for proximity effect correction calculation) by a predetermined size. The size of the proximity mesh region is preferably about $\frac{1}{10}$ of the influence radius of the proximity effect, such as about 1 μm. The ρ calculation unit 60 reads writing data from the storage device 140, and calculates, for each proximity mesh region, a pattern area density ρ of a pattern arranged in the proximity mesh region concerned.

Next, the $D_p$ calculation unit 62 calculates, for each proximity mesh region, a proximity effect correction irradiation coefficient $D_p$ for correcting a proximity effect. Here, the size of the mesh region to calculate the proximity effect correction irradiation coefficient $D_p$ does not need to be the same as that of the mesh region to calculate a pattern area density ρ. Moreover, the correction model of the proximity effect correction irradiation coefficient $D_p$ and its calculation method may be the same as those used in the conventional single beam writing system.

In the pattern-area-density-ρ'-in-pixel map generation step (S106), the ρ' generation unit 64 calculates, for each pixel 36, a pattern area density ρ' in the pixel 36 concerned. The mesh size of ρ' is set to be the same as the size of the pixel 28.

In the irradiation time t map generation step (S108), first, the D calculation unit 66 calculates, for each pixel (writing target pixel) 36, a dose D with which the pixel 36 concerned is irradiated. The dose D can be calculated, for example, by multiplying a pre-set reference dose $D_{base}$, a proximity effect correction irradiation coefficient $D_p$, and a pattern area density ρ'. Thus, it is preferable to obtain the dose D to be in proportion to a pattern area density calculated for each pixel 36.

Next, the t map generation unit 68 calculates, for each pixel 36, an electron beam irradiation time t for making the calculated dose D incident on the pixel 36 concerned. The irradiation time t can be calculated by dividing the dose D by a current density J. Then, the irradiation time t map which defines the irradiation time t acquired for each pixel 36 is generated. The generated t map is stored in the storage device 142.

In the count value $C_k$ map generation step (S110), first, the $C_k$ map generation unit 70 calculates, for each pixel 36, a count value $C_k$ which the counter 44 counts in each irradiation step for irradiating the pixel 36 concerned. Specifically, from the longest clock period in clock periods of a plurality of irradiation steps, an integer (fractional values are truncated) obtained by dividing the remaining irradiation time t of the pixel 36 concerned by the clock period concerned is defined as a count value $C_k$ of the irradiation step concerned. Here, it is defined as k=1, 2, . . . , and so on, in order, from the irradiation step of the longest clock period. In such a case, specifically, an integer (fractional values are truncated) obtained by dividing the irradiation time t defined in the irradiation time t map by the longest clock period is defined to be the count value $C_1$ of the irradiation step of the longest clock period. The count value $C_1$ can be defined by the following equation (5-1). Then, with respect to k=2 and after that, an integer (fractional values are truncated) obtained by dividing a remaining irradiation time, which is calculated by subtracting accumulation of values each being a multiplied value of the count value and the clock period in each previous irradiation step from the irradiation time t, by the clock period of the irradiation step concerned is defined as a count value $C_k$ of the irradiation step concerned. The count value $C_k$ can be defined by the following equation (5-2).

$$C_1 = \text{int}(t/\Delta t_1) \quad (5\text{-}1)$$

$$C_k = \text{int}\{(t - \Sigma C_{k-1} \cdot \Delta t_{k-1})/\Delta t_k\} \quad (5\text{-}2)$$

For example, in the case where the irradiation time of one shot of beam (1) of multi-beams is 700Δ, the example of FIG. 10 is described as follows: Here, it is defined as k=1, 2, and 3 in order from the irradiation step of the longest clock period. In the first irradiation step, since the clock period is $\Delta t_1 = 128\Delta$, $C_1 = \text{int}(700\Delta/128\Delta) = 5$. The remaining irradiation time is 60Δ (=700Δ-128×5Δ). In the second irradiation step, since the clock period is $\Delta t_2 = 16\Delta$, $C_2 = \text{int}(606/166) = 3$. The remaining irradiation time is 12Δ (=60Δ-16×3Δ=700Δ-(128×5Δ+16×3Δ)). In the third irradiation step, since the clock period is $\Delta t_3 = \Delta$, $C_3 = \text{int}(12\Delta/\Delta) = 12$.

The $C_k$ map generation unit 70 generates, for each irradiation step, a count value $C_k$ map which defines the count value $C_k$ acquired for each pixel 36. The generated count value $C_k$ map is stored in the storage device 142.

Next, the array processing unit 72 processes irradiation time array data (count value $C_k$ data, also called shot data) in the order of shots of beams. As explained with reference to FIG. 7, the pixel 36 adjacent in the direction of stage movement is not necessarily shot followingly. Therefore, the array processing unit 70 processes the order of the data such that the irradiation time array data of each pixel 36 is arranged in the order of pixels 36 shot by the multi-beams 20 sequentially in accordance with the writing sequence. The processed irradiation time array data (count value $C_k$ data) is stored in the storage device 142.

In the beam positioning step (S112), the writing control unit 86 specifies, for each pixel 36, a beam to irradiate the pixel concerned. In multi-beam writing, as described with reference to FIGS. 5 to 7, writing of the stripe region 30 proceeds by repeating the tracking cycle while shifting the pixel to be written. It depends on the writing sequence which beam of the multi-beams irradiates which pixel 36. For each pixel 36, the writing control unit 86 specifies a beam for the pixel 36 concerned which has been defined depending on the writing sequence, as a reference beam. In the case of FIG. 7, the beam (1) of coordinates (1, 3), for example, is specified as a reference beam for the first pixel from the right in the bottom row of the grid 29 concerned with respect to the shot concerned (a plurality of irradiation steps).

In the irradiation step ordinal number k setting step (S114), the k setting unit 74 sets an irradiation step ordinal number k. Here, it is set as k=1, 2, . . . , and so on, in order, from the irradiation step of the longest clock period. First, k=1 is set.

In the clock CLK2 setting step (S116), with respect to the clock period to control the irradiation time of each beam of multi-beams, the clock CLK2 setting unit 76 (setting unit) sets a plurality of clock periods $\Delta t_k$ including at least one clock period different from others such that the clock period of at least one exposure processing differs from clock periods of other exposure processing in multiple exposures of a plurality of shots of each beam of multi-beams where the plurality of shots continuously irradiate the same irradiation position. Specifically, the clock CLK2 setting unit 76 sets a clock period $\text{Et}_k$ corresponding to the irradiation step ordinal number k which has been set, as a period of the clock CLK2. Then, as will be described later, when performing another irradiation step, another clock period $\Delta t_k$ corresponding to the irradiation step concerned is set as a period of the clock CLK2.

In the data transmission step (S118), the transmission processing unit 78 transmits, in each irradiation step, irradiation time array data (count value $C_k$ data) of the irradiation step concerned to the deflection control circuit 130. The deflection control circuit 130 outputs, in each irradiation step, the irradiation time array data to the control circuit 41 for each beam.

As explained with reference to FIG. 4, since the shift register 40 is used for the control circuit 41, the deflection control circuit 130 transmits data of the irradiation step of the same sequential order, such as first, second and so on, in the order of beam array (or in the order of identification number) to each control circuit 41 of the blanking aperture array mechanism 204.

For example, the blankers arranged in a matrix in the blanking aperture array mechanism 204 are grouped by the row or column, and data is transmitted per group. Moreover, the deflection control circuit 130 outputs a reference clock signal (CLK1) for synchronization, a read signal (read) for data read-out, a reset signal rst of a counter, and a clock signal (CLK2) for the counter 44. The CLK generator 50 generates a reference clock (CLK1). The CLK divider 52 inputs a reference clock (CLK1) signal, divides the reference clock (CLK1), and generates a clock (CLK2) of a different clock period. Specifically, the CLK divider 52 inputs the reference clock (CLK1) signal, divides the reference clock signal (CLK1), and generates a clock (CLK2) signal (=1/$\Delta t_k$) corresponding to a clock period $\Delta t_k$ having been set.

For example, as the count value $C_k$ data of the first (here, k=1) irradiation step of beams 1 to 5, each n-bit (n=3) data of "53455" is transmitted from the posterior beam side. The shift register 40 for each beam transmits data to the next shift register 40 in order from the high-order side, based on a clock signal (CLK1). For example, with respect to the k-th data of the beams 1 to 5, based on five clock signals by CLK1, 3-bit data "5" is stored in the shift register 40 of the beam 1. 3-bit data "5" is stored in the shift register 40 of the beam 2. 3-bit data "4" is stored in the shift register 40 of the beam 3. 3-bit data "3" is stored in the shift register 40 of the beam 4. 3-bit data "5" is stored in the shift register 40 of the beam 5.

In the writing step (S120), the writing unit 150 controls, in each irradiation step (exposure processing), the irradiation time in the irradiation step concerned using a clock period which has been set in a plurality of clock periods including at least one clock period different from the others, and exposes respective corresponding irradiation positions on the target object 101 with the multi-beams 20. Concretely, in each irradiation step (exposure processing), the writing unit 150 controls the irradiation time in the irradiation step concerned using the clock period $\Delta t_k$ which has been set, and exposes respective corresponding irradiation positions on the target object 101 by using the multi-beams 20. The writing unit 150 specifically operates as described below.

The electron beam 200 emitted from the electron gun 201 (emitter) almost perpendicularly (e.g., vertically) illuminates the whole of the forming aperture array member 203 by the illumination lens 202. A plurality of quadrangular holes (openings) are formed in the forming aperture array member 203. The region including all the plurality of holes 22 is irradiated by the electron beam 200. For example, a plurality of quadrangular electron beams (multi-beams) 20a to 20e are formed by letting portions of the electron beam 200, which irradiates the positions of a plurality of holes 22, individually pass through a corresponding hole of the plurality of holes 22 of the forming aperture array member 203. The multi-beams 20a to 20e individually pass through corresponding blankers (first deflector: individual blanking mechanism) of the blanking aperture array mechanism 204. Each blanker maintains the state of the beam ON or OFF of the corresponding electron beam 20 which individually passes, based on a signal in the individual register 42, during the writing time (irradiation time) having been set for the irradiation step concerned. In other words, the blanking aperture array mechanism 204 controls, in each exposure processing, the irradiation time of multi-beams in the exposure processing concerned using a clock period which has been set in a plurality of clock periods including at least one clock period different from the others.

The multi-beams 20a to 20e having passed through the blanking aperture array mechanism 204 are reduced by the reducing lens 205, and go toward the hole in the center of the limiting aperture member 206. At this stage, the electron beam 20 which was deflected by the blanker of the blanking aperture array mechanism 204 deviates from the hole in the center of the limiting aperture member 206 (blanking aperture member), and is blocked by the limiting aperture member 206. On the other hand, the electron beam 20 which was not deflected by the blanker of the blanking aperture array mechanism 204 passes through the hole in the center of the limiting aperture member 206 as shown in FIG. 1. Thus, the limiting aperture member 206 blocks each beam which was deflected to be the OFF state by the individual blanking mechanism 47. Then, each beam of a plurality of irradiation steps obtained by dividing one shot is formed by a beam made during a period from becoming beam ON to becoming beam OFF and having passed through the limiting aperture member 206. The multi-beams 20 having passed through the limiting aperture member 206 are focused by the objective lens 207 so as to be a pattern image of a desired reduction ratio. Respective beams (the whole of the multi-beams 20) having passed through the limiting aperture member 206 are collectively deflected in the same direction by the deflectors 208 and 209 in order to irradiate respective beam irradiation positions on the target object 101. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes of the forming aperture array member 203 by a desired reduction ratio described above. In other words, by the optical system of the objective lens 207 and the like, in each exposure processing, the multi-beams 20, whose irradiation time in the exposure processing concerned is controlled using a clock period having been set in a plurality of clock periods including at least one different clock period, are focused to form an image on the target object 101.

In the determination step (S122), the determination unit 82 determines whether the irradiation step ordinal number k has reached m being the number of times of division. When k being the irradiation step ordinal number has reached the number of times of division, m, it proceeds to the determination step (S126). When the irradiation step ordinal number k has not reached m being the number of times of division, it proceeds to the irradiation step ordinal number k change step (S124).

In the irradiation step ordinal number k change step (S124), the k setting unit 74 changes k being the irradiation step ordinal number by adding 1 to k in order to obtain a new k. Then, it returns to the clock CLK2 setting step (S116). Then, each step from the clock CLK2 setting step (S116) to the irradiation step ordinal number k change step (S124) is repeated until k being the irradiation step ordinal number reaches m being the number of times of division in the determination step (S122).

Figure 11:
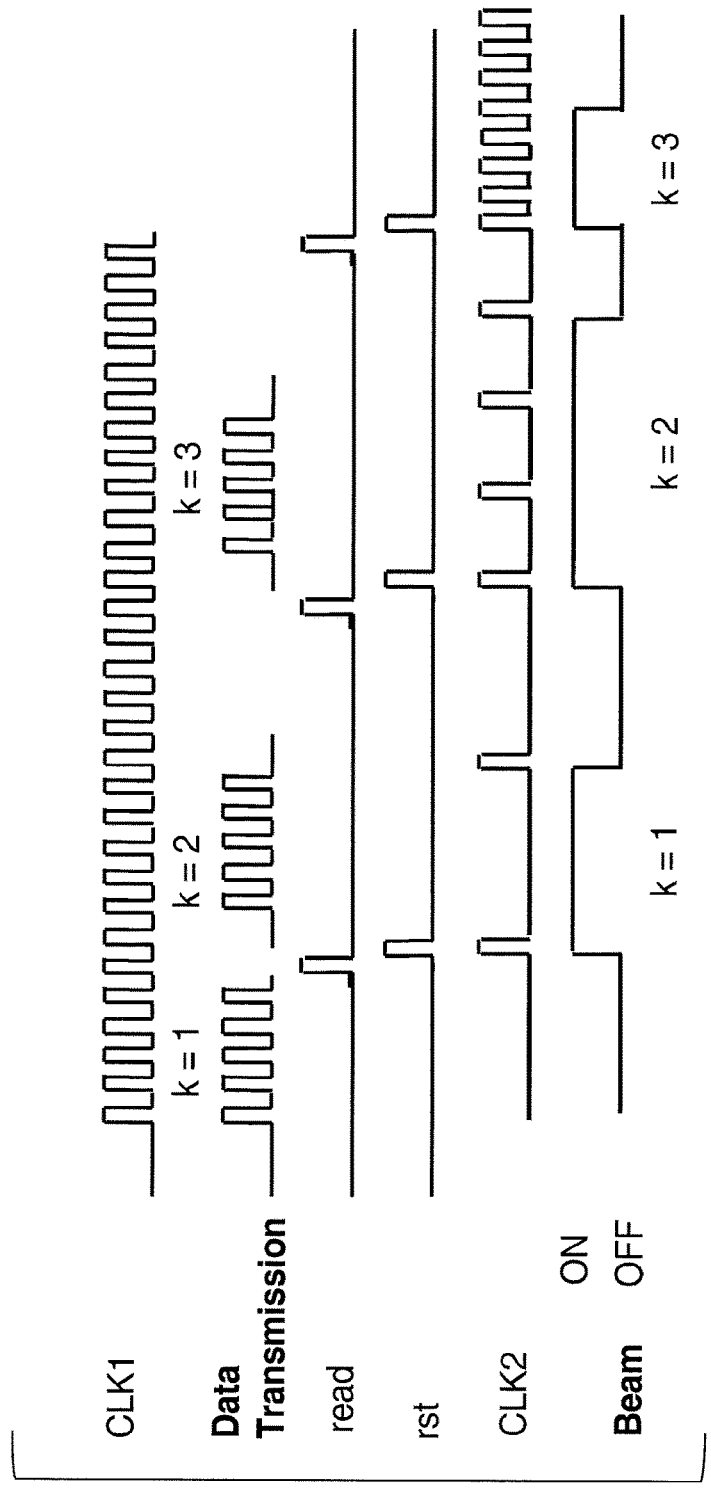
FIG. 11 shows examples of timing charts of signals and beam ON/OFF according to the first embodiment.

FIG. 11 shows examples of timing charts of signals and beam ON/OFF according to the first embodiment. FIG. 11 shows the case with respect to one beam. When the register 42 for each beam inputs a read signal (read), it reads the k-th (here, k=1) data of the beam concerned from the shift register 40 in response to the input read signal. When inputting the k-th data, the individual register 42 for each beam outputs a count value signal to the counter 44, based on the input k-th data. Then, inputting a reset signal rst, the counter 44 counts the count value input from the individual register 42, depending on a clock period $\Delta t_k$ of the k-th (here, k=1) clock (CLK2) signal. In the example of FIG. 10, the clock period $\Delta t_1 = 128\Delta$. While performing counting, the counter 44 outputs an ON signal to the amplifier 46, and then, the amplifier 46 applies an ON voltage to the electrode 24 of the individual blanking deflector. When having counted up to the count value, the counter 44 outputs an OFF signal to the amplifier 46, and then, the amplifier 46 applies an OFF voltage to the electrode 24 of the individual blanking deflector.

While the k-th (here, k=1) data is being processed, the deflection control circuit 130 transmits the next k-th (here, k=2) data to each control circuit 41 of the blanking aperture array mechanism 204 in the order of beam array (or in the order of identification number). Then, similarly, when the register 42 for each beam inputs a read signal (read), it reads the k-th (here, k=2) data of the beam concerned from the shift register 40 in response to the input read signal. When inputting the k-th data, the individual register 42 for each beam outputs a count value signal to the counter 44, based on the input k-th data. Then, inputting a reset signal rst, the counter 44 counts the count value input from the individual register 42, depending on a clock period $\Delta t_k$ of the k-th (here, k=2) clock (CLK2) signal. In the example of FIG. 10, the clock period $\Delta t_2=16\Delta$. While performing counting, the counter 44 outputs an ON signal to the amplifier 46, and then, the amplifier 46 applies an ON voltage to the electrode 24 of the individual blanking deflector. When having counted up to the count value, the counter 44 outputs an OFF signal to the amplifier 46, and then, the amplifier 46 applies an OFF voltage to the electrode 24 of the individual blanking deflector.

While the k-th (here, k=2) data is being processed, the deflection control circuit 130 transmits the next k-th (here, k=3) data to each control circuit 41 of the blanking aperture array mechanism 204 in the order of beam array (or in the order of identification number). Then, similarly, when the register 42 for each beam inputs a read signal (read), it reads the k-th (here, k=3) data of the beam concerned from the shift register 40 in response to the input read signal. When inputting the k-th data, the individual register 42 for each beam outputs a count value signal to the counter 44, based on the input k-th data. Then, inputting a reset signal rst, the counter 44 counts the count value input from the individual register 42, depending on a clock period $\Delta t_k$ of the k-th (here, k=3) clock (CLK2) signal. In the example of FIG. 10, the clock period $\Delta t_3=\Delta$. While performing counting, the counter 44 outputs an ON signal to the amplifier 46, and then, the amplifier 46 applies an ON voltage to the electrode 24 of the individual blanking deflector. When having counted up to the count value, the counter 44 outputs an OFF signal to the amplifier 46, and then, the amplifier 46 applies an OFF voltage to the electrode 24 of the individual blanking deflector.

As described above, by performing m irradiation steps, m being the calculated number of times, exposure corresponding to the period of the irradiation time for one beam shot can be performed.

In the determination step (S126), the determination unit 84 determines whether exposures of all the pixels have been completed. If the exposures of all the pixels have not been completed yet, it returns to the beam positioning step (S112). Then, each step from the beam positioning step (S112) to the determination step (S126) is repeated until exposures of all the pixels have been completed in the determination step (S126). When exposures of all the pixels have been completed, the writing processing is finished.

As described above, according to the first embodiment, it is possible to control a necessary irradiation time while suppressing the increase in the amount of data transmission in multi-beam exposure which performs multiple exposures.

Although a clock period $\Delta t_k$ different from the others is used in all the irradiation steps in the examples described above, it is not limited thereto. It is also preferable to use the different clock period $\Delta t_k$ in at least one irradiation step. In such a case, although the amount of data transmission increases, if compared to the method of the comparative example 2, the increase in the amount of data transmission can be greatly suppressed.

Embodiments have been explained referring to specific examples described above. However, the present invention is not limited to these specific examples. Although the above examples describe the case where a plurality of irradiation steps are performed once for each pixel, that is, each of the plurality of irradiation steps is respectively performed once for the pixel concerned, it is not limited thereto. Furthermore, it is also preferable to perform multiple writing with L passes. For example, a plurality of irradiation steps may be performed for each pass of the multiple writing with L passes.

As for the control circuit 41 mounted in the blanking aperture array mechanism 204, it is desirably manufactured with aluminum (Al) wiring whose generation is older than copper (Cu) wiring. This is because, since insulating films, etc. are formed more thickly in the case of wiring manufactured with Al, they are harder to be broken by irradiation of electron beams. When manufacturing with Al wiring, and forming the control circuit 41 individually for each beam of 512×512 multi-beams, for example, it is practically required to form it with about 5 bits or below because of the arrangement space. However, the case of manufacturing with Cu wiring, etc. is not excluded. Moreover, even in the case where the control circuit 41 can be compactly manufactured using Cu wiring, etc., if the number of beams increases, since the same problem occurs, the present invention is also effective for such a case.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi charged particle beam exposing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam exposing method comprising:
   setting, in multiple exposures by a plurality of shots of each beam of multi-beams where the plurality of shots continuously irradiate a same irradiation position, a plurality of clock periods including at least one different clock period where the plurality of clock periods individually control an irradiation time of the each beam of the multi-beams such that a clock period of at least one exposure processing differs from clock periods of other exposure processing; and
   exposing respective corresponding irradiation positions on a target object with the multi-beams by controlling, in each exposure processing of the multiple exposures, the irradiation time in exposure processing concerned using a clock period which has been set in the plurality of clock periods including the at least one different clock period.

2. The method according to claim 1, wherein a total value of a number of bits of irradiation time data defining the irradiation time of the each exposure processing in the multiple exposures is a number of bits of irradiation time data defining a settable maximum value of the irradiation time.

3. The method according to claim 1, wherein a range of the irradiation time to be controlled varies depending on the plurality of clock periods.

4. The method according to claim 1, wherein with respect to the plurality of clock periods, a value obtained by dividing a long clock period by a short clock period is set to be a power of 2.

5. The method according to claim 1, further comprising:
calculating, for each irradiation position on the target object, a count value by dividing the irradiation time of the exposure processing concerned by the clock period which has been set in the plurality of clock periods.

6. The method according to claim 5, wherein the count value is calculated for the each exposure processing of the multiple exposures.

7. The method according to claim 5, wherein, for the each irradiation position on the target object, an integer obtained by dividing the irradiation time based on which an irradiation position concerned is irradiated with a beam by a longest clock period in the plurality of clock periods is calculated as the count value of exposure processing corresponding to the longest clock period.

8. The method according to claim 7, wherein an integer obtained by dividing a remaining irradiation time, which is calculated by subtracting a multiplied value of the count value of the exposure processing corresponding to the longest clock period and the longest clock period from the irradiation time based on which the irradiation position concerned is irradiated with a beam, by a second longest clock period in the plurality of clock periods is calculated as a count value of exposure processing corresponding to the second longest clock period.

9. A multi charged particle beam exposing apparatus comprising:

a stage configured to mount a target object thereon;
a setting processing circuitry configured to set, in multiple exposures by a plurality of shots of each beam of multi-beams where the plurality of shots continuously irradiate a same irradiation position, a plurality of clock periods including at least one different clock period where the plurality of clock periods individually control an irradiation time of the each beam of the multi-beams such that a clock period of at least one exposure processing differs from clock periods of other exposure processing;
a clock generator configured to generate a reference clock;
a divider configured to generate the at least one different clock period;
a blanking aperture array mechanism configured to control, in each exposure processing, the irradiation time of the multi-beams in exposure processing concerned using a clock period which has been set in the plurality of clock periods including the at least one different clock period; and
an optical system configured to focus, in the each exposure processing, the multi-beams to form an image on the target object whose irradiation time in the exposure processing concerned is controlled using the clock period which has been set in the plurality of clock periods including the at least one different clock period.

10. The apparatus according to claim 9, wherein a total value of a number of bits of irradiation time data defining the irradiation time of the each exposure processing in the multiple exposures is a number of bits of irradiation time data defining a settable maximum value of the irradiation time.

* * * * *